March 10, 1970 P. H. CONWAY 3,500,381

HIGH SPEED ANALOG-TO-DIGITAL CONVERTER

Filed Nov. 21, 1966 10 Sheets-Sheet 1

INVENTOR
PATRICK H. CONWAY
BY Thomas J. Nikolai
ATTORNEY

HIGH SPEED ANALOG-TO-DIGITAL CONVERTER

INPUT UNIT

March 10, 1970 P. H. CONWAY 3,500,381
HIGH SPEED ANALOG-TO-DIGITAL CONVERTER
Filed Nov. 21, 1966 10 Sheets-Sheet 4
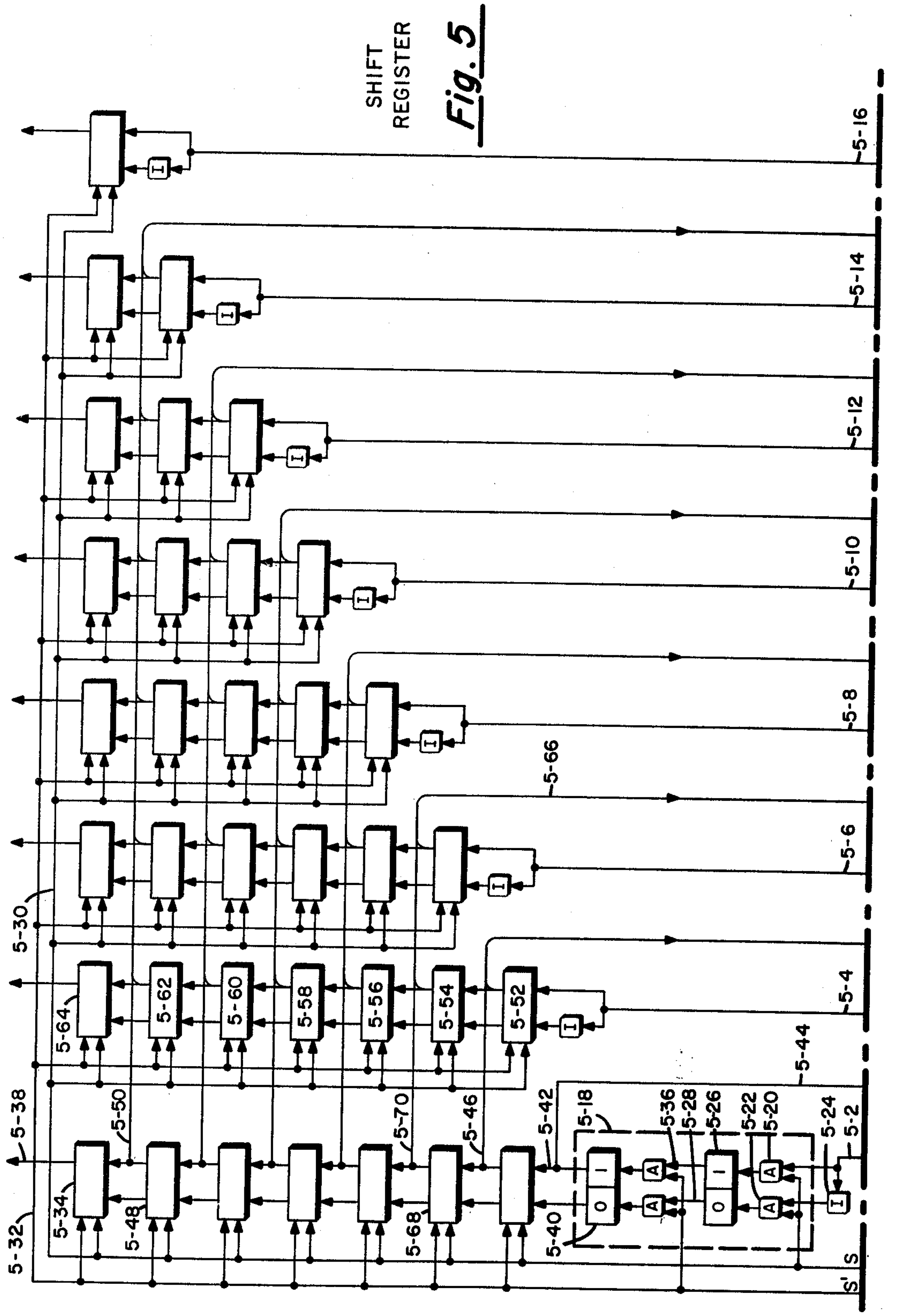
SHIFT REGISTER Fig. 5

HIGH SPEED ANALOG-TO-DIGITAL CONVERTER

Filed Nov. 21, 1966 10 Sheets-Sheet 7

March 10, 1970 P. H. CONWAY 3,500,381

HIGH SPEED ANALOG-TO-DIGITAL CONVERTER

Filed Nov. 21, 1966 10 Sheets-Sheet 9

3,500,381
HIGH SPEED ANALOG-TO-DIGITAL CONVERTER
Patrick H. Conway, Minneapolis, Minn., assignor to Sperry Rand Corporation, New York, N.Y., a corporation of Delaware
Filed Nov. 21, 1966, Ser. No. 595,945
Int. Cl. H03k 13/02
U.S. Cl. 340—347 10 Claims

ABSTRACT OF THE DISCLOSURE

A high speed analog-to-digital converter for converting a time varying input electrical signal such as a voltage sample into a digital output signal in one bit-time by having as many sample and hold circuits (each of which temporarily stores a different amplitude sample of said time varying input signal) as there are comparators which produce the binary bits representing a sample. The invention herein described was made in the course of or under a contract or subcontract thereunder, with the Department of the Army.

BACKGROUND OF THE INVENTION

Although there are many different types of analog voltage-to-digital converters, a commonly used basic method of converting a voltage to a digital quantity indicative of the analog value includes providing a cascaded series of comparators in which the sampled input analog voltage is provided to a comparator in the most significant digit position of the apparatus. The input analog voltage sample is compared with a reference voltage which is one-half the value of the full scale range of the input analog voltage. If the input voltage sample is larger, the comparator produces a first voltage level (or pulse) constituting a digital output which indicates a binary 1. If the input voltage sample is less than the reference voltage, the most significant bit is a binary 0 and is represented by a second voltage level (or pulse) output. If the most significant bit is a 0, the second comparator stage determines whether the input voltage sample is greater or less than one-fourth the full scale input range. If the most significant bit is a 1, one-half of the full scale input voltage is added to one-fourth the full scale input range and the second comparator stage determines whether the input sample is greater or less than three-quarters the input range. If the voltage sample is less than three-fourths the full scale range, the next bit is a 0 and if greater, the bit is a 1. If, therefore, at any of the comparator stages, the input analog voltage sample is smaller than the sum of the applied weighted reference voltage and the value of the weighted reference voltages applied to the stage in question by each higher order stage which produced an output indicative of a binary 1, then the comparator produces said second output voltage or pulse which is indicative of a binary 0. If the input voltage sample is larger, the comparator produces an output voltage or pulse indicating a binary 1. This procedure continues throughout all stages of the comparator until the least significant digit is generated. In this manner, a bit-by-bit conversion is effected and the total conversion time is equal to the sum of the conversion times of the individual comparator stages.

There are several disadvantages and problems attendant with the apparatus used in prior art systems. These problems occur through the use of delay lines to store input signals, distribute timing signals and store output signals. First, whether parallel or series delay lines are used, they cause each comparator to see a signal with different distortions. Secondly, cumulative tolerance of the delay lines must not exceed one comparator time tolerance or timing problems occur. Finally, the use of delay lines cause the apparatus to operate at a particular fixed speed.

SUMMARY OF THE INVENTION

The present invention overcomes the above difficulties by using clocking procedures. If does not use delay lines as storage devices and thus does not have timing problems due to delay tolerances and further has no cumulative distortion to be concerned with since any distortion which occurs is common to every stage. Also, synchronism of units is clock-controlled and the system timing is independent of component drift because it is digital, not analog, as are the delay lines. Finally, the present invention has a variable sampling rate depending upon the clock speed and therefore the speed of operation of the device can be varied.

The present invention makes possible the conversion of a time varying input electrical signal such as a voltage sample into a digital output signal in one-bit time by having as many sample and hold circuits (each of which temporarily stores a different amplitude sample of said time varying input signal) as there are comparators which produce the binary bits representing a sample. Series switches sequentially couple the sample and hold circuits to each of the comparators. For example, if 8-bits represent a voltage sample, 8 samples are sequentially stored in the sample and hold circuits and each sample is coupled simultaneously by a series switch to a different comparator for a particular length of time called a delay time or period. Thus, the 8 comparators would be operating on 8 different samples instantaneously. The comparator which produces the most significant bit (MSB) has connected to its output a shift register comprising a column of 8 serially connected stages (for this example) each of which includes first and second flip-flops. The output of the second comparator is coupled to a second shift register comprising a column of 7 of such serially connected stages. Similarly, each of the succeeding comparators has its output connected to a shift register comprising a column of serially connected stages the number of which is one less than the number in the shift register coupled to the preceding comparator. Thus, the comparator producing an output representing the least significant bit (LSB) is coupled to one stage. This shift register arrangement enables each comparator to operate simultaneously on different voltage samples. Thus, during a first time interval, each comparator is examining a different sample. During a second time interval, the comparator producing the most significant bit operates on a new sample while the next comparator now examines the first sample and so fourth until during the eighth time interval, the first comparator is examining the eighth sample while the comparator producing the least significant bit is coupled to the first sample. Since the signal produced by the first comparator which represented the first sample has progressed successively through the 7 stages of the first shift register, it now appears at the output of the eighth stage simultaneously with the least significant bit of the first sample from the last comparator. Thus, it can be seen that the 8 comparators are generating a complete binary word at the same rate as previous comparators generated one bit of the word.

BRIEF DESCRIPTION OF THE DRAWINGS

These and other more detailed and specific objects will be disclosed in the course of the following specification, reference being had to the accompanying drawings, in which;

FIG. 5 is a schematic representation of one embodiment of the novel shift register unit to be used in an analog-to-digital converter;

DESCRIPTION OF THE PREFERRED EMBODIMENT

Input unit

Figure 1:
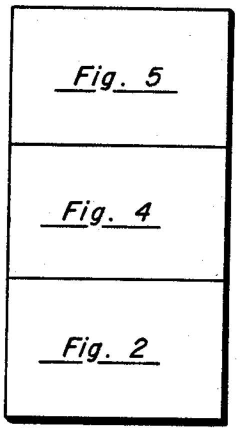
FIG. 1 shows how FIGS. 2, 3 and 4 interconnect to form the circuit diagram of a preferred embodiment of this invention.
Figure 3:
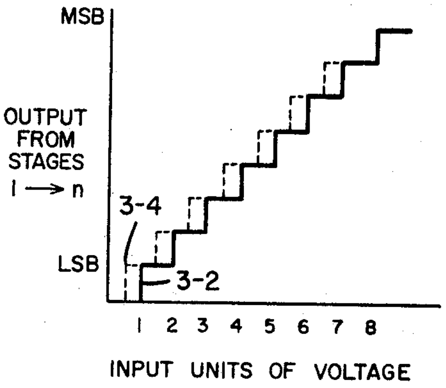
FIG. 3 is a graph showing how the quantizing error is reduced by coupling a bias signal to the input of the converter.
Figure 2:
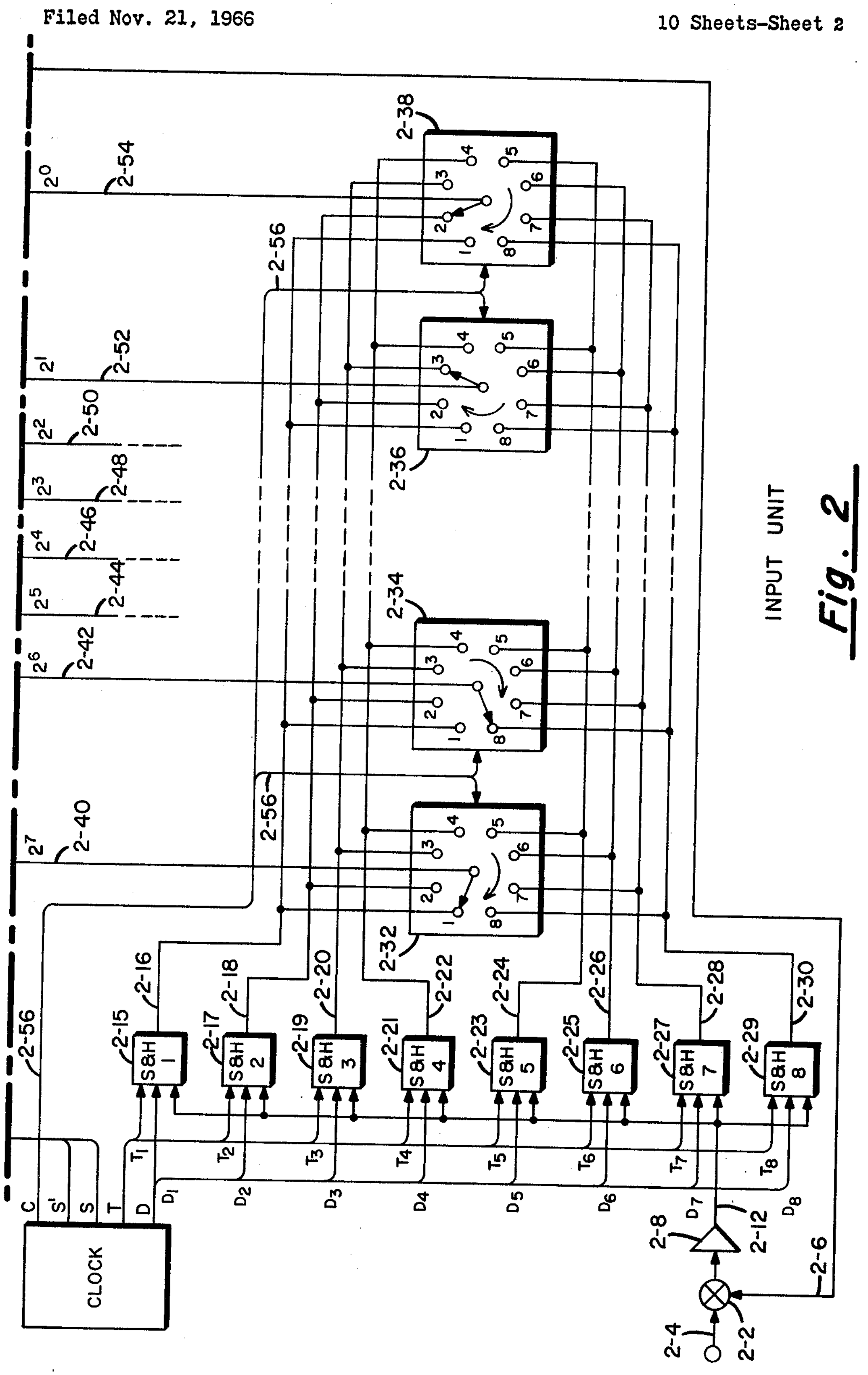
FIG. 2 is a schematic representation of the inventive input unit to be used in an analog-to-digital converter.

FIG. 2 is a schematic representation of the input unit of an analog-to-digital converter that produces, for purposes of example only, 8 binary digits to represent an input analog voltage sample. It includes at least *n* sample and hold circuits (8 in the present example) each of which is adapted to at least temporarily store a different amplitude sample of said time varying input signal. Summation unit 2–2 sums the input analog sample on line 2–4 with a voltage representing one-half the least significant bit on the line 2–6. The purpose of adding one-half the least significant bit to the input analog voltage sample is to reduce the quantizing error by coupling a bias equivalent to one-half the value of the least significant bit to the input. Without such feedback, the error would be from 0 to the full amount of the least significant bit. The solid line 3–2 in FIG. 3 shows how, during normal operations without feedback, each of the 8 comparators produces an output when a particular level or unit of the input voltage is reached. Thus, unless one full unit of input voltage is reached, the LSB comparator will not produce an output. However, when a bias voltage representing one-half of the least significant bit is coupled to the input, the output of the comparators shifts from curve 3–2 to curve 3–4. Now it can be seen that the LSB comparator will produce an output when the input voltage ranges between ½ and 1½ units. This causes the possible error to be reduced to a maximum of one-half of the least significant bit (½LSB). Continuing with FIG. 2, the output of summation unit 2–2 is coupled to amplifier 2–8 and thence to sample and hold circuits 2–15 through 2–29 via line 2–12. Successive pulses $T_1$–$T_8$ on line 2–14 form a commutating means coupled to said *n* sample and hold circuits (2–15 through 2–29 in this example) for sampling said time varying input signal and storing successive ones of *n* samples in individual ones of said *n* sample and hold circuits during each of *n* delay times or periods. Since it has been assumed, for purposes of illustration only, that an 8 bit binary word represents an input analog voltage sample, 8 sample and hold circuits 2–15 through 2–29 are shown in FIG. 2. It should be understood that *n* sample and hold circuits can be used for a *n* bit word. For every binary bit of the digital word representing an input analog voltage sample, a sample and hold circuit is required.

Sample and hold circuit

Figure 7:
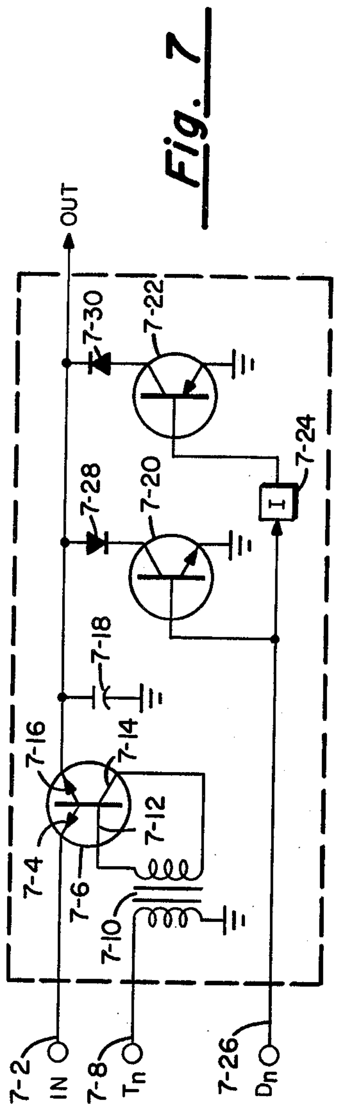
FIG. 7 is a circuit diagram of a sample and hold circuit to be used in the input unit of FIG. 2.

A typical sample and hold circuit used in FIG. 2 is shown in detail in FIG. 7. The input analog signal on line 2–12 in FIG. 2 would be present on line 7–2 in FIG. 7. This signal is coupled to emitter 7–4 of dual emitter gating transistor 7–6 which acts as an analog switch. When it is desired to sample the analog voltage on line 7–2, a sample pulse $T_n$, is applied to line 7–8. This sample pulse is coupled to the primary winding of transformer 7–10. The secondary winding of transformer 7–10 is coupled between the base 7–12 and the collector 7–14 of transistor 7–6. The voltage induced in the secondary winding of transformers 7–10 causes dual emitter transistor 7–6 to conduct and a sample of analog voltage appearing on line 7–2 is coupled from emitter 7–4 to emitter 7–16 and thence to capacitor 7–18 where the sample is stored. Both positive and negative input signals can be stored in capacitor 7–18 since double emitter transistor 7–6 will pass either polarity. Once an input analog sample is stored in capacitor 7–18, the capacitor must be completely discharged, or the signal dumped, before it can receive a new input voltage. The dumping action occurs when a dump pulse $D_n$ is applied to the base of transistor 7–20 and the base of transistor 7–22 through inverter 7–24 via line 7–26. If the signal stored in capacitor 7–18 is positive, the capacitor will discharge through diode 7–28 and transistor 7–20 to ground. However, if the signal stored on condenser 7–28 is negative, the condenser will discharge through diode 7–30 and transistor 7–22 to ground.

Thus, each of the sample and hold circuits comprises a gating transistor having a first emitter for receiving a time varying input electrical signal which has both first and second polarities, a second emitter for providing an output, a collector and a base, a transformer having a primary winding for receiving a timing signal and a secondary winding connected between said collector and base of said transistor for causing said transistor to conduct as long as said timing signal is applied to said primary winding whereby a sample of said time varying signal is passed from said first emitter to said second emitter as said output, a condenser connected between said second emitter and a source of potential for storing said sample of said time varying signal, first means for providing a first discharge path for said signal sample of a first polarity stored in said condenser, and second means for providing a second discharge path for said signal sample of a second polarity stored in said condenser, said first and second means for providing said first and second discharge paths comprising first and second polarity transistors respectively, each of said transistors having a collector, a base and an emitter means connecting said emitters of said first and second transistors to said source of potential, means connected to the base of each of said first and second transistors for receiving a timing pulse for causing said transistors to form an electrical conduction path between their respective collectors and emitters, a first diode connected with the proper polarity in series with the collector of said first polarity transistor and said condenser to provide a discharge path for a second polar-signal sample stored by said condenser, and a second diode connected with the proper polarity in series with the collector of said second polarity transistor and said condenser to provide a discharge path for a second polarity signal sample stored by said condenser.

Figure 11:
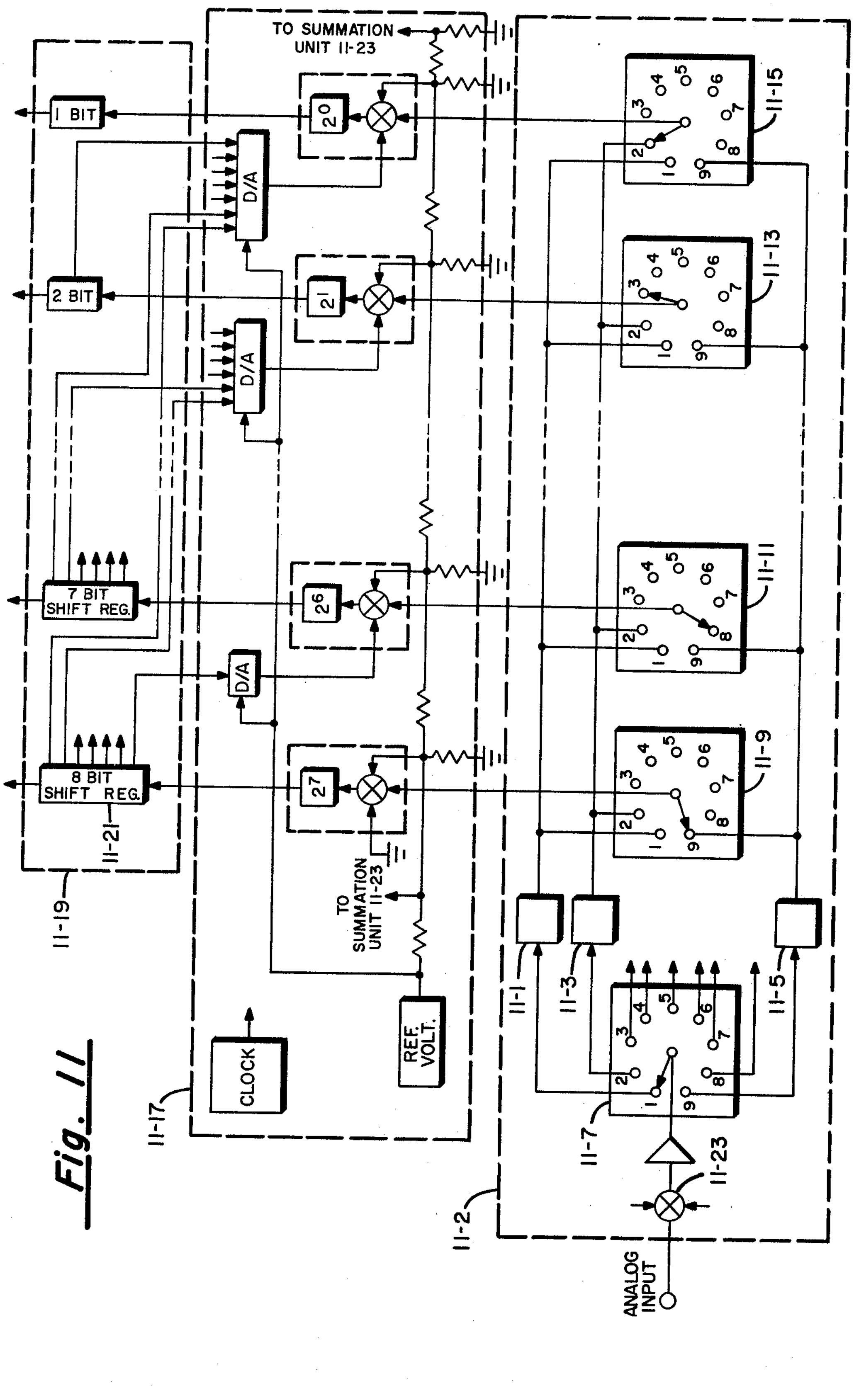
FIG. 11 is a schematic representation of an alternative embodiment of the present invention.
Figure 13:
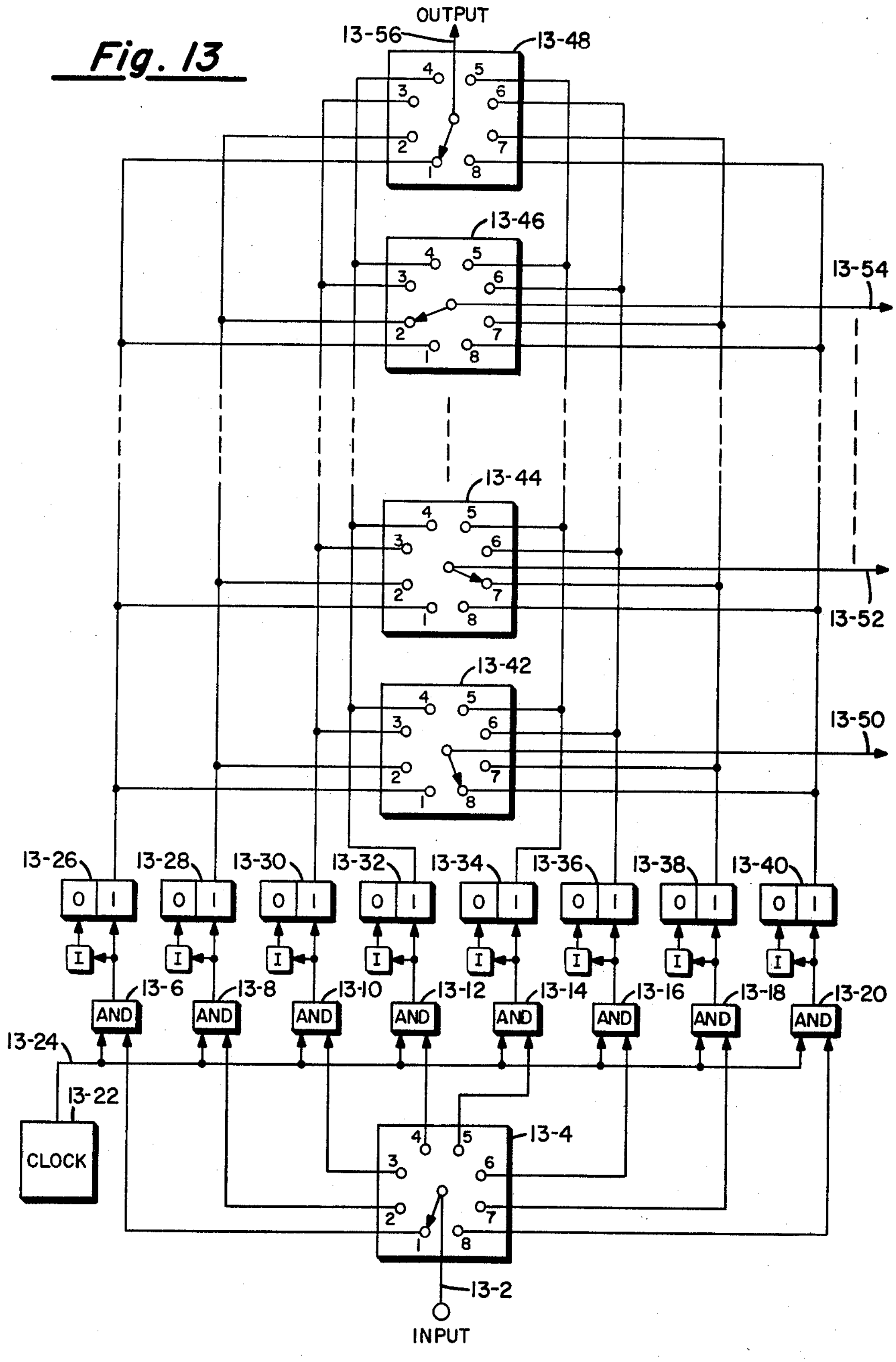
FIG. 13 is a first schematic representation of a shift register unit for the alternative embodiment of the invention.

Each of the sample and hold circuits 2–15 through 2–29 shown in FIG. 2 is similar to that shown in detail in FIG. 7. The output of each sample and hold circuit 2–15 through 2–29 on lines 2–16 through 2–30 respectively is connected to a terminal of each of the series switches 2–32 through 2–38 which are, in effect, commutators. For purposes of simplicity only four series switches are shown in FIG. 2. However, four others should be used to make the circuit complete for this particular example. The series switches shown in FIG. 2 are merely schematic representations of a commutating device which sequentially connects an output line of each sample and hold circuit to a single comparator circuit. In practice, the switching means need have no moving parts and it is to be understood that the representation used in FIGURES 2, 11 and 13 are merely to facilitate an understanding of the commutation operation. Thus, terminals 1 through 8 of series switch 2–32 are connected to the outputs of the 8 sample and hold circuits respectively. As the switch arm in series switch 2–32 rotates, it couples each of the terminals 1 through 8 successively to a comparator via output line 2–40.

Series switches

Figure 6:
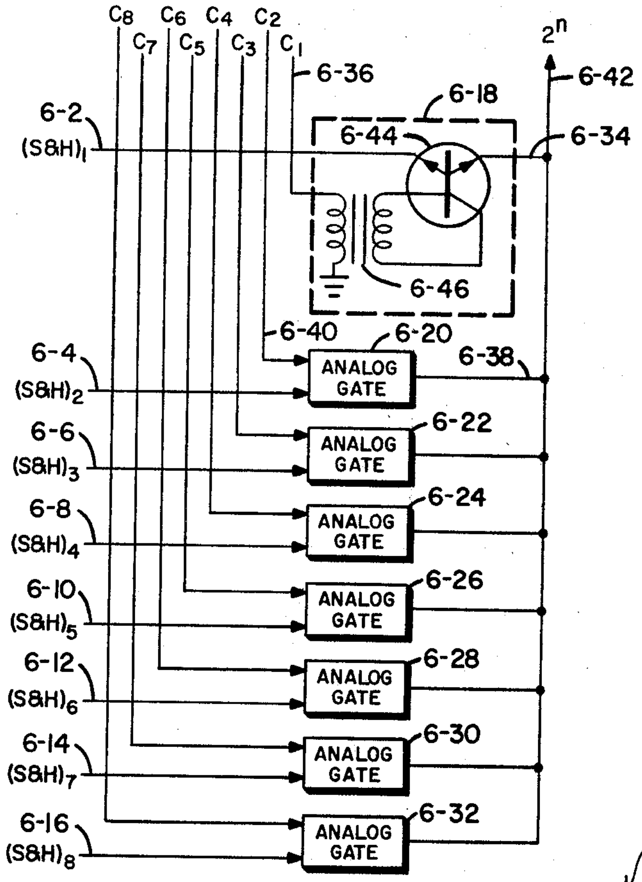
FIG. 6 is a circuit diagram of one of the series switches used in the input unit of FIG. 2.

FIG. 6 shows in detail a circuit diagram of one of the series switches or commutators. The respective output from each of the sample and hold circuits 2–15 through 2–29 on lines 6–2 through 6–16 respectively is coupled as one input to a respective one of gates 6–18 through 6–32. Also coupled to each of the respective gates are timing pulses $C_1$ through $C_8$ each of which is, in effect, a delay time. These pulses are represented schematically in FIG. 2 as being coupled to the series switches by line 2–56. Thus, whenever a timing pulse is applied thereto, each of the gates produces an output signal whose amplitude is equal to the value of the analog input signal sample stored in the sample and hold circuit. Gate 6–18 is shown in detail and includes a dual emitter transistor 6–44 which has the input analog sample on line 6–2 coupled to one emitter thereof and output line 6–34 coupled to the other emitter. The secondary winding of transformer 6–46 is coupled across the base and collector of transistor 6–44. When a clock pulse appears on line 6–36, a pulse is produced by transformer 6–46 which turns on transistor 6–44. Thus, gate 6–18 produces an analog output on line 6–34 whenever it has an input timing pulse $C_1$ on line 6–36 and the analog output from the first sample and hold circuit on line 6–2. This analog voltage on line 6–34 represents the voltage sample stored in the first sample and hold circuit. Also, an output from gate 6–20 appears on line 6–38 the magnitude of which is equal to the analog voltage sample stored in the second sample and hold circuit whenever timing pulse $C_2$ appears on line 6–40. Each of the remaining gates 6–22 through 6–32 operates in a similar manner. It will be seen that the analog voltage samples stored by the eight sample and hold circuits are sequentially coupled to output line 6–42 by gates 6–18 through 6–32 during $n$ delay times where $n=8$ in the present example. Thus, the series switches form commutating means coupled to said $n$ sample and hold circuits (8 in this example) and said $n$ comparator means (8 in this example) for successively coupling each of said $n$ sample and hold circuits to a different one of said $n$ comparators during each of said $n$ delay times.

Referring again to FIG. 2, it will be seen that at any one particular instant in time, output lines 2–40 through 2–54 from series switches 2–32 through 2–38 respectively each carry a particular analog voltage sample which was stored by one of the sample and hold circuits 2–14. Therefore, the contents of all eight sample and hold registers are simultaneously applied to the eight corresponding comparators in FIG. 4. It will be noted that the movable arms of the series switches 2–32 through 2–38 rotate in a clockwise direction and that the arm of series switch 2–32 engages terminal 1 while the arm of series switch 2–38 engages terminal 2. It will therefore require eight clock pulses before the arm of series switch 2–38 contacts terminal 1. Thus, the analog voltage sample stored in the first sample and hold circuit will appear on the output line 2–40 during a first bit-time interval and then on line 2–54 seven bit-time intervals later.

Comparator unit

Figure 4:
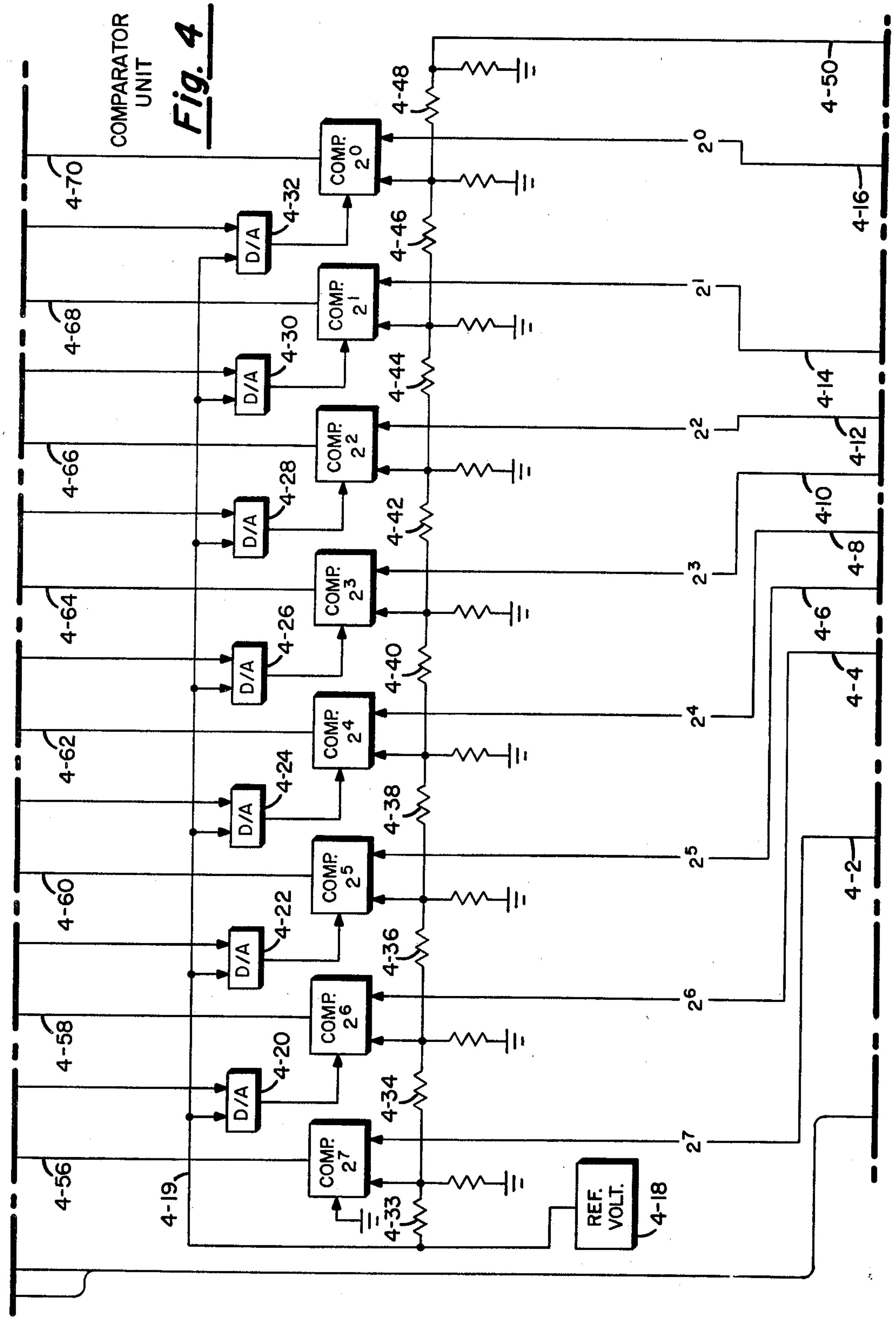
FIG. 4 is a schematic representation of the comparator unit of an analog-to-digital converter.

Lines 4–2 through 4–16 in FIG. 4 couple the analog signals from the series switches 2–32 through 2–38 respectively in FIG. 2 to the compartors $2^7$ through $2^0$ respectively in FIG. 4. Voltage source 4–18 produces a reference voltage or predetermined threshold signal level that may be reduced by resistance network 4–33 to one-half the full scale input range of the analog voltage that is to be applied to the comparator $2^7$. The reference voltage is not only coupled to compartor $2^7$ through resistance network 4–33, but also to digital-to-analog converters 4–20 through 4–32 via line 4–19. Resistance networks 4–34 through 4–48 are voltage dividing networks which reduce the voltage applied to them by one-half. Thus, for example, if the full scale range of the analog voltage which is to be converted to digital signals is 8 volts, the reference voltage from source 4–18 would reduce to 4 volts by resistance network 4–33. This 4 volts would be applied to comparator $2^7$ while resistance network 4–34 would reduce the 4 volts by one-half thus applying 2 volts to comparator $2^6$. In a like manner, one volt would be applied to comparator $2^5$, one-half volt to the comparator $2^4$, and so forth until $1/32$ of a volt would be applied to comparator $2^0$.

Thus, the voltage on line 4–50 is one-half of the voltage applied to the last comparator $2^0$ and is therefore equal to one-half the value of the least significant bit (½LSB) and is used as a bias value shown in FIG. 2 on line 2–6 and is applied to summation network 2–2 in order to reduce the quantizing error as previously explained under the heading Input Unit.

Comparator

Figure 9:
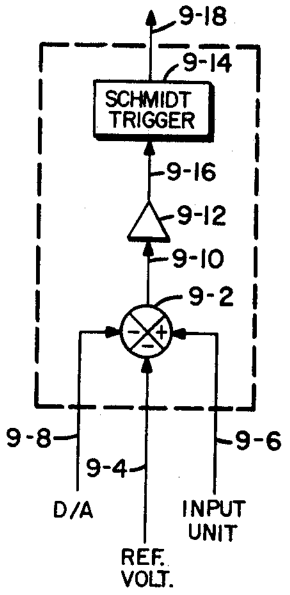
FIG. 9 is a schematic representation of a comparator used in the comparator unit shown in FIG. 4.

FIG. 9 shows in detail one of the comparator circuits $2^7$ through $2^0$. Summation network 9–2 receives as input signals the proper reference voltage on line 9–4, the analog voltage sample from the series switches in the input unit on line 9–6 and the voltage from the digital-to-analog converter on line 9–8.

Network 9–2 produces a signal on output line 9–10 whenever the input analog sample on line 9–6 is greater than the sum of the other two input signals. For purposes of example only, if the analog voltage from the series switch on line 9–6 were 7 volts, the reference voltage on line 9–4 is 4 volts and the voltage on line 9–8 from the digital-to-analog converter is 2 volts, summation unit 9–2 produces a positive one voltage signal on line 9–10. This signal is amplified by amplifier 9–12 and applied to Schmitt trigger 9–14 via line 9–16.

Schmitt trigger 9–14 produces a first voltage level or pulse on line 9–18 which represents a binary 1. If the output from summation unit 9–2 on line 9–10 is a negative voltage, Schmitt trigger 9–14 produces a second voltage level such as, for example, a zero signal level which represents a binary 0 on line 9–18. Thus, the outputs of comparators $2^7$ through $2^0$ on lines 4–56 through 4–70 respectively are pulses of either a first or second level which represent binary 1's or binary 0's respectively. If the output voltage from any of the comparators $2^7$ through $2^1$ is a binary 1, it is desired that the weighted reference voltage applied to that stage be applied to all of the succeeding stages through digital-to-analog converters 4–20 through 4–32 at successive time intervals. Thus, if the output from comparator $2^7$ is a binary 1, it is desired that the weighted reference voltage of that stage be applied to digital-to-analog converter 4–20 at time $S_1$, to digital to analog converter 4–22 at time $S_2$, etc., to digital-to-analog converter 4–32 at time $S_7$. In a like manner, if the output from comparator $2^6$ is a binary 1 on line 4–58, it is desired that the weighted reference voltage of that stage be applied to digital-to-analog converter 4–22 at time interval $S_2$, to digital-to-analog converter

4–24 at time $S_3$ etc., to digital-to-analog converter 4–32 at $S_7$.

Thus, there are *n* comparator means, each adapted to compare the amplitude samples held in a respective one of said *n* sample and hold circuits with a predetermined threshold signal level for producing an output data signal of a first binary value when said amplitude sample exceeds said threshold level and a second binary value when said amplitude sample falls below said threshold value.

Shift registers

The shift register unit for causing the delay times at which the digital-to-analog converters are activated is shown in FIG. 5. This unit produces the *n*-bit digital output and includes *n* shift registers, where *n* is an integer, each connected to receive the output from a corresponding one of said *n* comparator means with the shift register coupled to the comparator producing the most significant bit having *n* delay times for a data signal applied thereto and each succeeding shift register having one less delay time than the preceding shift register. Thus, for each of the comparators $2^7$ through $2^0$ in FIG. 4, there is a shift register including a group of series-connected shift stages each of which consists of a pair of flip-flops as shown in FIG. 5. There is one shift stage for comparator $2^0$, two series-connected stages for comparator $2^1$, three series-connected stages for comparator $2^2$, etc., through eight series-connected stages for comparator $2^7$. Each of these stages represents one delay time or period. Only one of these stages, 5–18, is shown in detail in FIG. 5. However, all of the others are identical to that one shown in detail.

The signals received from comparators $2^7$ through $2^0$ in FIG. 4 on lines 5–2 through 5–16 respectively in FIG. 5 are coupled to the first shift stage in each group related to the respective comparator. The signal from comparator 2–7 is coupled via line 5–2 directly to AND gate 5–20 and to AND gate 5–22 through inverter 5–24. Also coupled to AND gates 5–20 and 5–22 is shift pulse $S_1$ on line 5–30. If the signal from comparator $2^7$ on line 5–2 is a binary 0, or, for example, a 0 voltage level, the output of inverter 5–24 is a signal which is coupled to AND gate 5–22. At time $T_1$, a shift pulse, $S_1$, is applied to AND gate 5–22 which causes the binary signal on line 5–2 to be stored in flip-flop 5–26. Thus, AND gate 5–22 causes flip-flop 5–26 to produce an output signal on line 5–28. Shift pulse $S_1$ likewise causes the first flip-flop in each shift circuit to store the binary signal applied to it. At time $S'_1$, a delayed shift pulse on line 5–32 causes the data stored in the first flip-flop to be stored in the second flip-flop in each of the shift stages. It will be seen, then, when each pair of shift and delayed shift pulses $S_2$, $S'_2$, $S_3$, $S'_3$, etc., through $S_8$, $S'_8$, are applied successively to all shift stages, the binary signal stored in the first flip-flop of each stage in each group will be progressively passed from one stage to the other until it reaches the last of the series coupled shift stages in each particular group. Thus, the 0 signal stored in flip-flop 5–26 of shift circuit 5–18 will be successively shifted until it is stored in shift circuit 5–34.

In a like manner, if the output from comparator $2^7$ is a binary 1, input line 5–2 will couple this voltage directly to AND gate 5–20 where at time $S_1$, AND gate 5–20 will produce an output which will set the one side of flip-flop 5–26 thus causing an output on line 5–36. As described above, this signal representing a binary 1 will be sequentially passed from one shift stage to the other at times $S'_1$, $S_2$, $S'_2$, $S_3$, $S'_3$, and so on through $S_8$, $S'_8$ at which time it will appear on line 5–38 at the output of stage 5–34. Notice, too, at time $S'_1$ when flip-flop 5–40 is set and the 1 signal is produced on line 5–42, the signal is also coupled via line 5–44 back to the digital-to-analog converter 4–20 in FIG. 4. Also, at time $S'_2$, the output of propagate serially through the stages until time $S'_7$ when 5–46 which is coupled back to digital-to-analog converter 4–22 in FIG. 4. This sequence continues until time $S'_7$ at which time the first signal applied to the first stage becomes the output of stage 5–48 on line 5–50 and is coupled back to digital-to-analog converter 4–32 in FIG. 4. Similarly, if comparator $2^6$ produces a binary 1 as an output signal, it will be received on input line 5-4 and stored by stage 5–32 until at time $S'_2$ it will be coupled with the signal on line 5–46 back to digital-to-analog converter 4–22. At time $S'_3$, it will be coupled to digital-to-analog converter 4–24 on line 5–66 along with the signal from stage 5–68 on line 5–70. This signal will continue to the second succeeding shift stage is present on line it will appear at the output of stage 5–62 and, along with the signal from stage 5–48 on line 5–50 it will be coupled back to digital-to-analog converter 4–32 in FIG. 4.

Thus, to summarize FIG. 5, a signal that is received from comparator $2^7$ is successively stored and shifted a number of time intervals equal to the number of bits desired to represent a sample. If 8-bits are used to represent a digital word indicative of an input analog voltage sample, then the output from comparator $2^7$, which is the most significant bit, is successively stored and shifted for 8 time intervals. In like manner, the output from each succeeding comparator is delayed one less time interval than the output from the preceding comparator. Thus, the output from comparator $2^6$ would be delayed, in this example, 7 time intervals. Likewise, the output from comparator $2^5$ would be delayed 6 time intervals. This would continue through comparator $2^0$ whose output would be delayed one time interval. Thus, each digital-to-analog converter receives an input signal from the proper stage of the shift register associated with each preceding comparator that has produced a binary 1.

Therefore the shift register coupled to the comparator producing the most significant bit includes *n* serially connected stages with each succeeding shift register including one less stage than the preceding shift register, each of said stages comprising first and second flip-flops having inputs and outputs, first gate means coupling to said first flip-flop for receiving data signals and shift pulses for enabling storage of said data signals in said first flip-flop upon receipt of ones of said shift pulses and second gate means coupled to said first and second flip-flops for receiving delayed shift pulses for permitting the transfer of said data in said first flip-flop to said second flip-flop upon receipt of one of said delayed shift pulses whereby said data is serially transferred from stage to stage in a shift register as said shift pulses and delayed shift pulses are applied thereto.

Digital-to-analog converters

Figure 8:
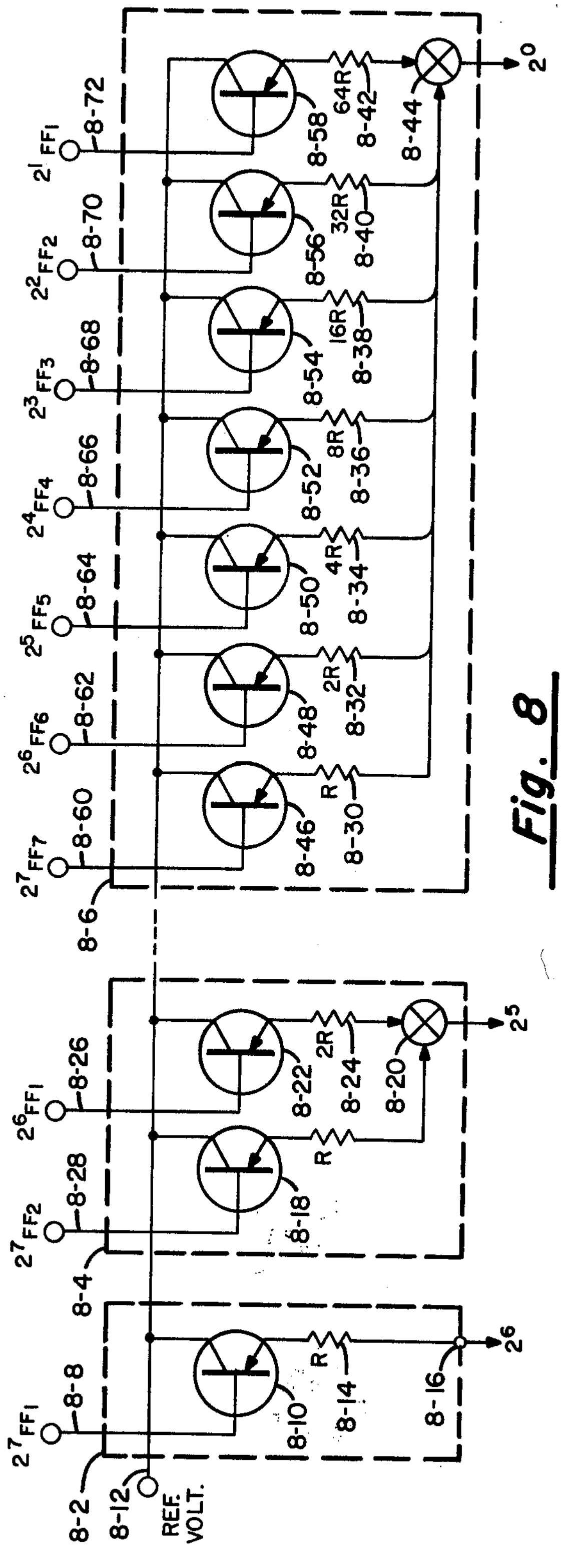
FIG. 8 is a circuit diagram of the digital-to-analog converters used in the comparator unit shown in FIG. 4.

The digitial-to-analog converters 4–20 through 4–32 which are shown schematically in FIG. 4 are shown in detail in FIG. 8. For purposes of simplicity in the drawings, only three digital-to-analog converters are shown in FIG. 8. The first of these, unit 8–2, represents digital-to-analog converter 4–20 in FIG. 4. Similarly, unit 8–4 in FIG. 8 is the same as unit 4–22 in FIG. 4. Also unit 8–6 in FIG. 8 is the same as unit 4–32 in FIG. 4. As can be seen in FIG. 8, unit 8–2 has one transistor, unit 8–4 has two transistors, and unit 8–6 has seven transistors. In like manner, those units which are not shown in FIG. 8 would have 3, 4, 5 and 6 transistors respectively and would operate in a similar manner. Each of these transistors acts as a switch and if a signal is received on the base from a shift register stage, the reference voltage on the collector is passed through the transistor to the emitter and through the emitter-resistor to the summation unit of the comparator. Thus in unit 8–2, if a signal is received on line 8–8 from the first stage of the shift register coupled to the output of comparator $2^7$, transistor 8–10 conducts and the reference voltage on line 8–12 passes through transistor 8–10 and through emitter-resistor 8–14. Emitter-resistor 8–14 has a value of resistance, R, which is sufficient to allow a voltage equal to one-half the value of the full scale range of the input voltage to appear at terminal 8–16. In unit 8–4, transistor 8–18 operates in a similar manner to transistor 8–10 and, if a signal is coupled to its base from the second stage of the shift register that is coupled to comparator $2^7$, transistor 8–18 conducts and a voltage equal to one-half the full scale range of the input voltage is presented at summation unit 8–20. Transistor 8–22 has an emitter-resistor 8–24 that has a value of 2R or twice the value of the emitter-resistor of transistor 8–10 and transistor 8–18. Thus, if a signal is coupled to the base of transistor 8–22 on line 8–26 from the first stage of the shift register connected to comparator $2^6$, transistor 8–22 conducts and the voltage developed at summation unit 8–20 is one-half of the voltage produced by transistor 8–18. If it is assumed that binary 1 signals are appearing on lines 8–8, 8–28 and 8–26, and further assuming that one-half the full scale input range is, for purposes of example only, 4 volts, transistor 8–10 will produce 4 volts at terminal 8–16, transistor 8–18 will produce a signal of 4 volts at summation unit 8–20, and transitsor 8–22 will produce a voltage of 2 volts at summation unit 8–20. Thus, summation unit 8–10 will develop 6 volts output because of transistors 8–18 and 8–22. Likewise in unit 8–6, resistors 8–30 through 8–42 which are coupled in the emitters of the transistors 8–46 through 8–58 respectively have values of R, 2R, 4R, 8R, 16R, 32R and 64R respectively. In this particular example where one-half the full scale input range is 4 volts, the voltages that are summed by unit 8–44 are 4 volts, 2 volts, 1 volt, one-half volt, one-quarter volt, one-eighth volt and one-sixteenth volt. This occurs, of course, only when binary 1's are present on each of the lines 8–60 through 8–72. Thus, line 8–60 will have a binary 1 present from the seventh stage of the shift register connected to the comparator $2^7$, line 8–62 will have a binary 1 from the sixth stage of the shift register connected to comparator $2^6$, line 8–64 will have a binary 1 from the fifth stage of the shift register connected to comparator $2^5$, and so forth through line 8–72 which will have a binary 1 from the first stage of the shift register connected to comparator $2^1$.

Timing chart

Figure 10:
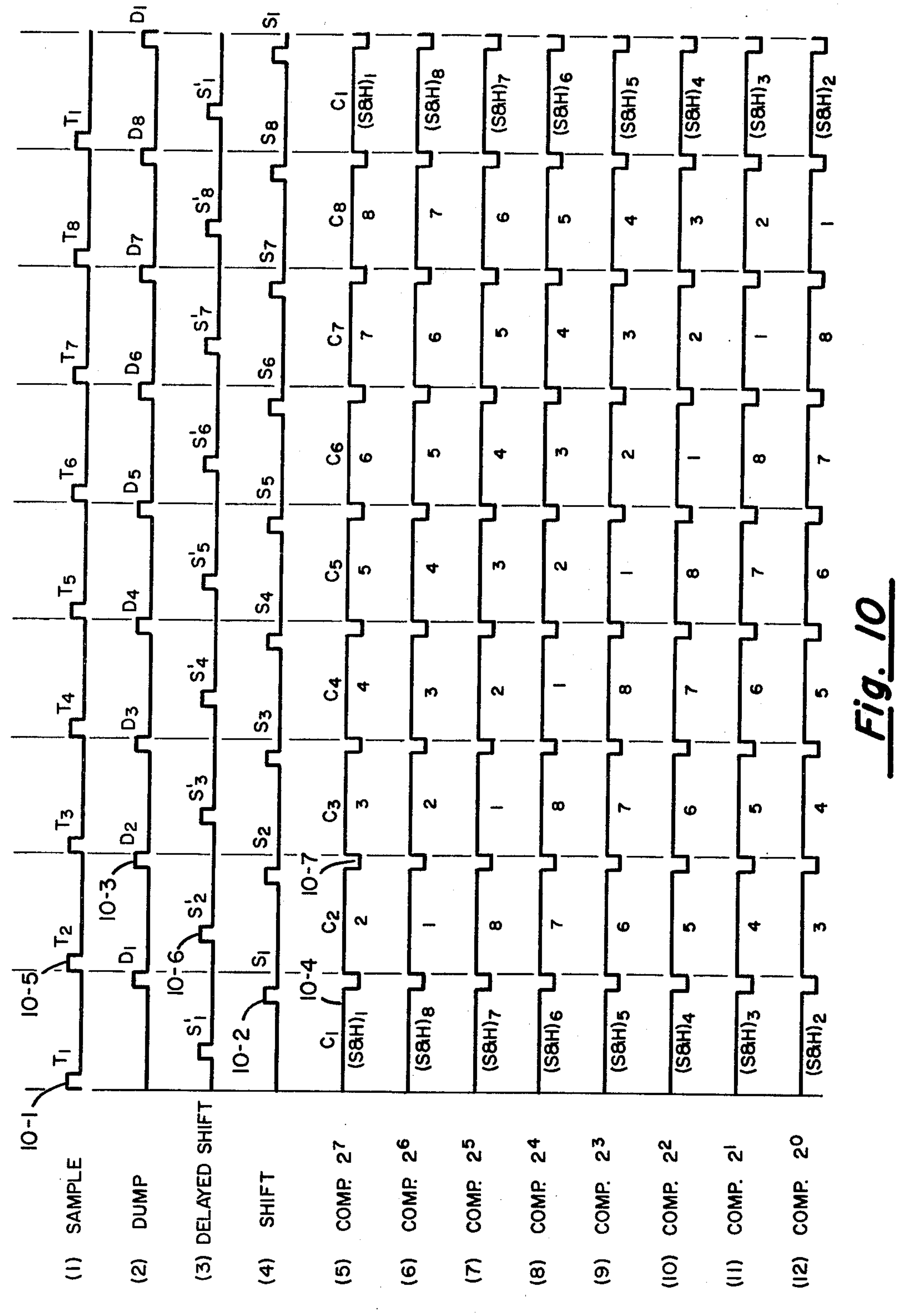
FIG. 10 shows a timing chart for the operation of the preferred embodiment of the present invention.

A complete understanding of the A/D converter can best be had by considering the timing chart in FIG. 10. Assume that an 8-bit binary word is to be used to represent each input analog voltage sample. Assume further that each bit time is equal to one-tenth of a microsecond with .01 microsecond used for a sample pulse at the beginning of each word time and .09 microsecond of the bit time being used for a comparator time with the last .01 microsecond thereof being used for a dump pulse to clear the sample and hold circuits. Refer now to the timing chart of FIG. 10. During the first .01 microsecond, sample pulse 10–1 causes the input analog voltage to be sampled and stored in the first sample and hold unit. This input voltage sample is coupled via line 4–2 in FIG. 4 to comparator $2^7$ along with the reference signal from reference source 4–18. If the input voltage sample is larger than the reference voltage, comparator $2^7$ produces a binary 1 on line 4–56. This comparison takes place within .08 microsecond following the first sample pulse.

If it is assumed that each of the other sample and hold units in storing an analog sample to be converted to a digital word, FIG. 10 shows that during the .09 microsecond of comparator time 10–4, each of the other comparators $2^6$ through $2^0$ is performing a similar comparison operation on the analog voltage samples stored in their respective sample and hold units. During the last .01 microsecond interval of the comparator time, shift pulse 10–2 is applied via line 5–30 in FIG. 5 to all of the shift register stages to store the output voltage from each comparator in the first flip-flop of the first stage of each shift register associated with a particular comparator, as well as to all of the first flip-flops in all the other stages in order that they might store the information from the preceding flip-flop. After the comparison is made and stored in the flip-flops, it is necessary to use the remaining .01 microsecond of the bit time to dump the stored voltage sample in the next sample and hold unit that is to receive a new or current analog sample. If we assume that initially, as shown in FIG. 2, comparator $2^7$ is coupled to the first sample and hold circuit 2–14 via terminal 1 of series switch 2–32, then the second sample and hold circuit 2–17 must be prepared to receive a new or current analog input sample by dumping the old stored sample. Therefore, in FIG. 7 the dump pulse would be applied on line 7–26 to the base of transistors 7–20 and 7–22. Thus, the old stored sample is dumped or discharged. Dump pulse 10–3 shown in FIG. 10 is the pulse which is applied to the second sample and hold circuit 2–17 to cause the voltage sample stored by condenser 7–18 in FIG. 7 to be discharged.

Thus, the cycle begins again with sample pulse $T_2$ shown as pulse 10–5 in FIG. 10 causing a new analog voltage sample to be stored in the sample and hold circuit 2–17 in FIG. 2. A new comparison is now begun. Shortly thereafter, a delayed shift pulse 10–6 is applied to line 5–32 in FIG. 5 which is coupled to each of the second flip-flops in each of the stages 5–18. This delayed shift pulse causes the data stored in the first flip-flop to be transferred to the second flip-flop thus allowing the first flip-flop to accept new data from the comparators whenever a shift pulse appears on line 5–30.

As may be seen from the timing chart in FIG. 10, one-tenth of the comparator time, or bit time, is required to dump the sample stored by the sample and hold circuits. This is shown by interval 10–7 under dump pulse 10–3 in FIG. 10. This means that the comparators do not have a full bit time in which to make a comparison and the dump time is actually lost time. This condition can be remedied by utilizing the circuit shown in FIG. 11.

Modified input unit

Figure 12:
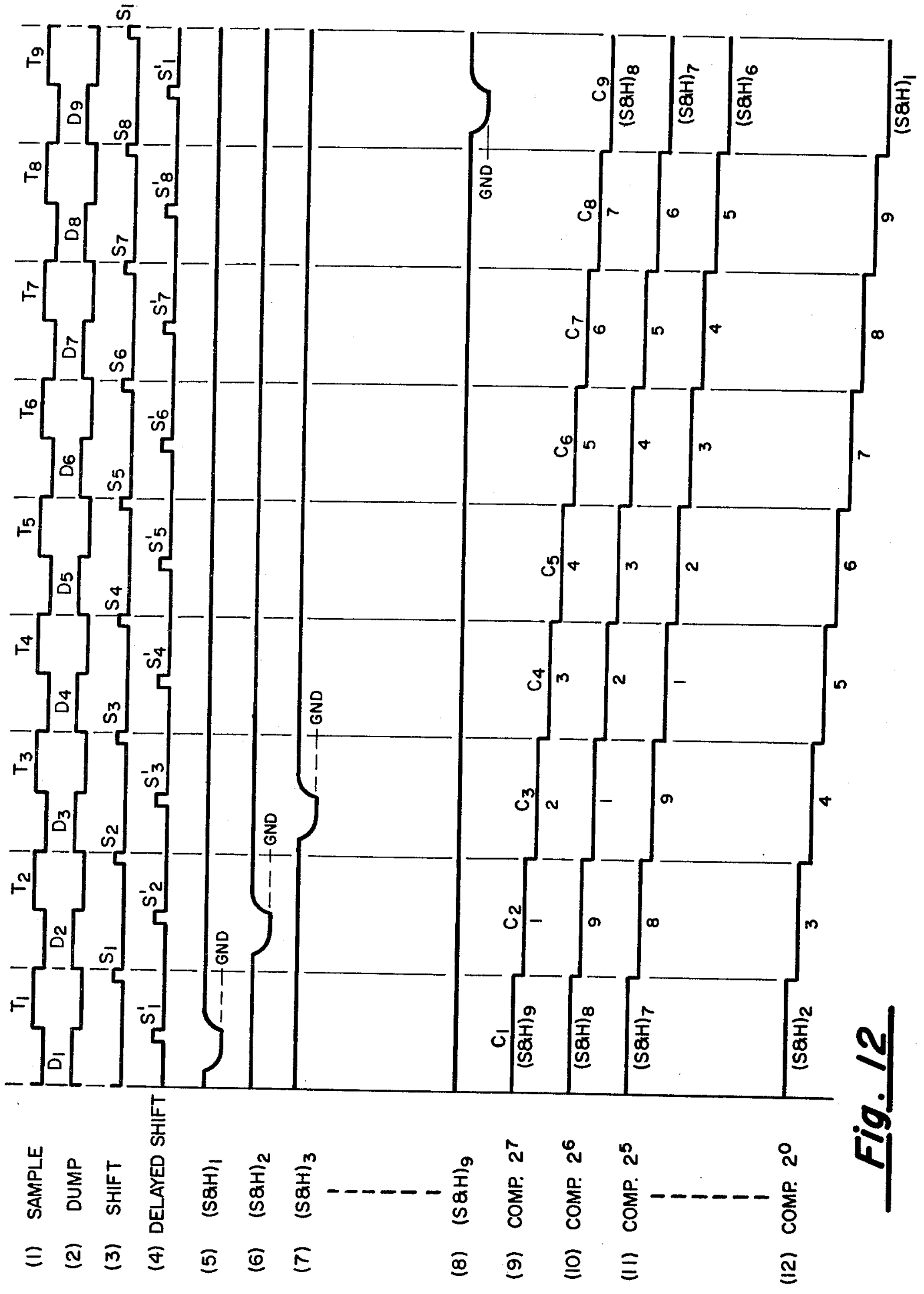
FIG. 12 is a timing chart for the operation of the alternative embodiment of the invention.

In FIG. 11, input unit 11–2 utilizes nine sample and hold circuits 11–1 through 11–5. Analog signals are coupled into the nine sample and hold circuits by series switch 11–7 which has one input and nine successively commutated outputs. This commutation takes place in a manner similar to that shown in FIG. 2 except that nine sample and nine dump pulses are required. These sample and dump pulses are shown in FIG. 12 as waveforms 1 and 2. The output of each of the sample and hold circuits is successively commutated by eight series switches 11–9 through 11–15 to the eight comparator circuits $2^7$ through $2^0$ in comparator unit 11–17. Again, these switches operate in a manner similar to those switches shown in FIG. 2 and FIG. 6 except that nine comparator pulses, $C_1$ through $C_9$, are required. These nine comparator pulses are shown in FIG. 12 in any of the waveforms 9 through 12.

Considering now FIG. 12, it may be seen in waveform 2 that during the first half of a bit time when dump pulse $D_1$ occurs, sample and hold circuit #1 dumps or discharges its stored analog voltage sample as shown in waveform 5. At the same time, however, it will be noted that each of the eight comparators, $2^7$ through $2^0$, is connected to one of the other eight sample and hold circuits as shown in waveforms (9) through (12). During the last half of the bit time, sample pulse $T_1$ shown in waveform 1 causes sample and hold circuit #1 to store a new value of analog voltage as shown in waveform 5. By the end of the bit time, the newly stored value of the analog voltage in sample and hold circuit #1 has stabilized and is now ready to be successively commutated to the eight comparator circuits $2^7$ through $2^0$. During the first half of the second bit time interval, dump pulse $D_2$ causes the sample and hold circuit #2 to dump its stored analog signal as shown by waveform 6 while sample and hold circuits #1 and #3–#9 are connected to the eight comparator circuits $2^7$ through $2^0$. This process continues with eight of the sample and hold circuits being connected to eight comparators while one of the sample and hold circuits is always utilizing one bit time to discharge the old analog voltage sample and to store the new value of analog voltage. Thus, from FIG. 12 it is apparent that there is no dead time in which the comparators are not operating.

Therefore, the A-to-D converter utilizing the modified input unit comprises in combination input means including at least $n+1$ sample and hold circuits each of which is adapted to at least temporarily store a different amplitude sample of said time varying input signal, $n$ comparator means, each adapted to compare the amplitude samples held in a respective one of said $n+1$ sample and hold circuits with a predetermined threshold signal level for producing an output data signal of a first binary value when said amplitude sample exceeds said threshold level and of a second binary value when said amplitude sample falls below said threshold value, commutating means coupled to said $n+1$ sample and hold circuits and said $n$ comparator means for successively coupling the output of each of a group of said $n+1$ sample and hold circuits to a different one of said $n$ comparators during each of $n+1$ delay times, a different group of said $n$ circuits being coupled to said $n$ comparators during each of said $n+1$ delay times, and a shift register unit for producing the $n$-bit digital output, said shift register unit including $n$ shift registers, where $n$ is an integer, each connected to receive the output from a corresponding one of said $n$ comparator means with the shift register coupled to the comparator producing the most significant bit having $n$ delay times for a data signal applied thereto and each succeeding shift register having one less delay time than the preceding shift register.

Modified shift register

The shift register unit 11–19 may be modified to provide faster and more reliable shifting of the binary bits produced by the comparators. The modified system requires more equipment, however, to obtain the desired increase in speed. The eight bit shift register 11–21 shown in FIG. 11 is shown in detail in modified form in FIG. 13.

The output from comparator $2^7$ is present on line 13–2 which is coupled to the movable arm of the commutator or series switch 13–14. Thus, the comparator signal is successively commutated to each of the contacts 1–8 of series switch 13–4. Contacts 1–8 are connected respectively to AND gates 13–6 through 13–20. When clock 13–22 produces an output on line 13–24, the AND gate that is receiving the comparator signal produces an output which is stored in one of the respective flip-flops 13–26 through 13–40. The output of each of the flip-flops is connected to each of the series switches 13–42 through 13–48. If an eight bit binary word is to be used to represent the analog voltage samples, eight series switches are required in the eight bit shift register. For purposes of clarity in the drawings, only four of the series switches are shown. The output from flip-flop 13–26 is connected to contact 1 of all the series switches. In like manner, the output from each of the flip-flops 13–28 through 13–40 is respectively connected to contacts 2 through 8 of the series switches. The movable arms of switches 13–42 through 13–46 provide outputs which are connected to the D/A converters of succeeding stages. Thus, the output on line 13–50 is coupled to the D/A converter of stage $2^6$. The output of series switch 13–44 on line 13–52 is coupled to the D/A converter of stage $2^5$. Similarly, the output of series 13–46 on line 13–54 is connected to the D/A converter of stage $2^0$. Series switch 13–48 is the final stage of the eight bit shift register and produces the output binary signals on line 13–56. It will be noted that each of the movable arms of series switches 13–42 through 13–48 rests on a different numbered contact at any one instant. This enables the binary information to be successively propagated through the shift register. Thus the information stored in flip-flop 13–26 is sampled in the first bit time by series switch 13–42 and the output is coupled to the D/A converter of stage $2^6$. Two bit-times later, the information stored in flip-flop 13–26 is sampled by series switch 13–44 and the output is coupled to the D/A converter of stage $2^5$. Similarly, seven bit-times later, the information in flip-flop 13–26 is sampled by series switch 13–46 and the output is coupled to the D/A converter of stage $2^0$. Finally, eight bit-times later, the information in flip-flop 13–26 is sampled by series switch 13–48 and produced as an output on line 13–56.

It will be seen that the modified shift register comprises a first commutator having one input and $n$ outputs, $n$ additional commutators for providing said $n$ delay times and each having $n$ inputs and one output with each succeeding shift register having one less commutator than the preceding register and $n$ storage flip-flops for receiving said digital signals for a respective comparator. Each of said flip-flops have an input from one of said $n$ outputs of said first commutator and have an output coupled to a particular one of said input terminals of each of said remaining commutators.

Figure 14:
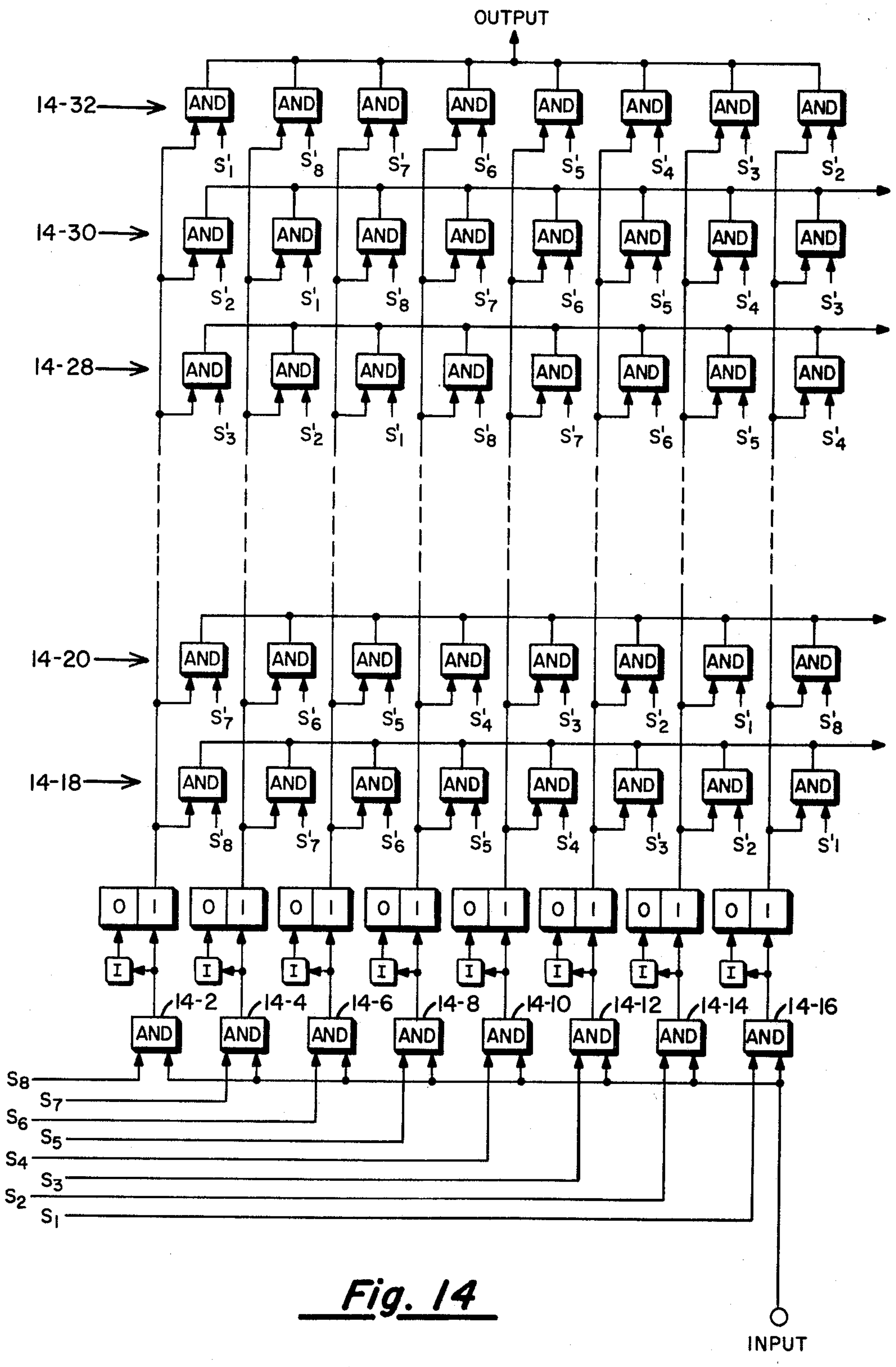
FIG. 14 is a second schematic representation of a shift register unit for the alternative embodiment of the invention.

FIG. 14 shows the details of the eight bit shift register shown in FIG. 13. Thus, the input series switch that receives information from the comparator is shown as comprising the eight AND gates 14–2 through 14–16 with the associated clock pulses $S_1$ through $S_8$. The AND gate that has the clock pulse applied will produce the output. Shift pulses $S_1$ through $S_8$ are shown in timing chart in FIG. 12. Each of the eight series switches is represented by one of the rows of AND gates 14–18 through 14–32. Also coupled to each of these AND gates is one of the delayed shift pulses $S'_1$ through $S'_8$. It will be noted that the manner in which the delayed pulses are connected to each of the rows of AND gates enables each of the flip-flop outputs to be sampled at any particular instant.

Thus each of said commutators includes $n$ AND gates each having first and second inputs and an output, said first commutator having means connecting all of said first inputs together for receiving an input digital signal, means coupling each of $n$ respective sequential gating signals to a corresponding one of said second inputs for causing said input digital signal to be applied to an individual AND gate at one time, and means coupling the output of each AND gate to a respective one of said storage flip-flops, each of said $n$ commutators having means connecting the output of each of said $n$ storage flip-flops to said first input of a corresponding one of said AND gates, and means coupling each of $n$ respective delayed sequential gating signals to said second input of a respective one of said AND gates to produce only one output from each commutator at any one time.

Each of the remaining shift registers is constructed in a similar manner except that for each succeeding register, one less series switch is required. Thus, in the seven-bit shift register connected to comparator stages $2^6$, only seven series switches are required. Similarly, in the one-bit shift register connected to comparator stage $2^0$, only one series switch is required.

Thus, there has been disclosed a digital method of translating an analog input voltage into a digital quantity indicative of its value. Each comparator can operate on a new analog sample as soon as it has completed a decision because the decision is stored in an auxiliary device. This allows the comparator to operate at its inherent maximum rate. Sample and hold circuits store the input analog voltage and their output is successively commutated to the various comparators. It has also been shown that for an $n$-bit converter, $n+1$ sample and hold circuits can be provided. This allows a clock cycle for dumping the hold circuit and for re-sampling and provides a wide sampling aperture relative to a clock period.

It is understood that suitable modifications may be made in the structure as disclosed provided such modifications come within the spirit and scope of the appended claims. Having now, therefore, fully illustrated and described my invention, what I claim to be new and desire to protect by Letters Patent is:

1. An analog-to-digital converter for converting a time varying input electrical signal to an *n*-bit digital signal grouping representative of said input electrical signal comprising in combination:

(a) input means including at least *n* sample and hold circuits each of which is adapted to at least temporarily store a different amplitude sample of said time varying input signal, (b) *n* comparator means, each adapted to compare the amplitude samples held in a respective one of said *n* sample and hold circuits with a predetermined threshold signal level for producing an output data signal of a first binary value when said amplitude sample exceeds said threshold level and of a second binary value when said amplitude sample falls below said threshold value, (c) commutating means coupled to said *n* sample and hold circuits and said *n* comparator means for successively coupling each of said *n* sample and hold circuits to a different one of said *n* comparators during each of *n* delay times, and (d) a shift register unit for producing the *n*-bit digital output, said shift register unit including *n* shift registers, when *n* is an integer, each connected to receive the output from a corresponding one of said *n* comparator means with the shift register coupled to the comparator producing the most significant bit having *n* delay times for a data signal applied thereto and each succeeding shift register having one less delay time than the preceding shift register.

2. An *n*-bit analog-to-digital converter of the type in claim 1 wherein said input means includes:

(a) commutating means coupled to the input of said *n* sample and hold circuits for sampling said time varying input signal and storing successive ones of *n* samples in individual ones of said *n* sample and hold circuits during said *n* delay times.

3. An *n*-bit analog-to-digital converter of the type in claim 1 wherein said shift registers include:

(a) *n* serially connected stages in said shift register coupled to the comparator producing the most significant bit with each succeeding shift register including one less stage than the preceding shift register, each of said stages comprising:

(1) first and second flip-flops, having inputs and outputs, (2) first gate means coupled to said first flip-flop for receiving data signals and shift pulses for enabling storage of said data signals in said first flip-flop upon receipt of respective ones of said shift pulses, and (3) second gate means coupled to said first and second flip-flops for receiving delayed shift pulses for permitting the transfer of said data in said first flip-flop to said second flip-flop upon receipt of one of said delayed shift pulses whereby said data is serially transferred from stage to stage in a shift register as said shift pulses and delayed shift pulses are applied thereto.

4. An *n*-bit analog-to-digital converter of the type in claim 1 wherein said shift registers comprise:

(a) a first commutator having one input and *n* outputs, (b) *n* additional commutators for providing said *n* delay times and each having *n* inputs and one output with each succeeding shift register having one less commutator than the preceding shift register, and (c) *n* storage flip-flops for receiving said digital signals from a respective comparator, each of said flip-flops having an input from one of said *n* outputs of said first commutator and having an output coupled to a particular one of said input terminals of each of said remaining commutators.

5. An *n*-bit analog-to-digital converter as in claim 4 wherein:

(a) each of said commutators includes *n* AND gates each having first and second inputs and an output, (b) said first commutator having (1) means connecting all of said first inputs together for receiving an input digital signal, (2) means coupling each of *n* respective sequential gating signals to a corresponding one of said second inputs for causing said input digital signal to be applied to an individual AND gate at one time, and (3) means coupling the output of each AND gate to a respective one of said storage flip-flops, (c) each of said *n* commutators having (1) means connecting the output of each of said *n* storage flip-flops to said first input of a corresponding one of said AND gates, and (2) means coupling each of *n* respective delayed sequential gating signals to said second input of a respective one of said AND gates to produce only one output from each commutator at any one time.

6. A sample and hold circuit as in claim 1 comprising:

(a) a gating transistor having a first emitter for receiving said time varying input electrical signal which has both first and second polarities, a second emitter for providing an output, a collector and a base, (b) a transformer having a primary winding for receiving a timing signal and a secondary winding connected between said collector and base of said transistor for causing said transistor to conduct as long as said timing signal is applied to said primary winding whereby a sample of said time varying signal is passed from said first emitter to said second emitter as said output, and (c) means coupled to said second emitter for storing said sample of said time varying signal.

7. A circuit as in claim 6 wherein said storing means comprises:

(a) a condenser connected between said second emitter and a source of potential.

8. A circuit as in claim 7 further including:

(a) first means for providing a first discharge path for said input signal samples of a first polarity stored in said condenser, and (b) second means for providing a second discharge path for said input signal samples of a second polarity stored in said condenser.

9. A circuit as in claim 8 wherein said first and second means for providing said first and second discharge paths comprises:

(a) first and second polarity transistors respectively, each of said transistors having a collector, a base and an emitter, (b) means connecting said emitters of said first and second transistors to said source of potential, (c) means connected to the base of each of said first and second transistors for receiving a timing pulse for causing said transistors to form an electrical conduction path between their respective collectors and emitters, (d) a first diode connected with the proper polarity in series with the collector of said first polarity transistor and said condenser to provide a discharge path for a first polarity signal stored by said condenser, and (e) a second diode connected with the proper polarity in series with the collector of said second polarity transistor and said condenser to provide a discharge path for a second polarity signal stored by said condenser.

10. An analog-to-digital converter for converting a time varying input electrical signal to an $n$-bit digital signal grouping representative of said input electrical signal comprising in combination:

(a) input means including at least $n+1$ sample and hold circuits each of which is adapted to at least temporarily store a different amplitude sample of said time varying input signal, (b) $n$ comparator means, each adapted to compare the amplitude samples held in a respective one of said $n+1$ sample and hold circuits with a predetermined threshold signal level for producing an output data signal of a first binary value when said amplitude sample exceeds said threshold level and of a second binary value when said amplitude sample falls below said threshold value, (c) commutating means coupled to said $n+1$ sample and hold circuits and said $n$ comparator means for successively coupling the output of each of a group of $n$ of said $n+1$ sample and hold circuits to a different one of said $n$ comparators during each of $n+1$ delay times, a different group of said $n$ circuits being coupled to said $n$ comparators during each of said $n+1$ delay times, and (d) a shift register unit for producing the $n$-bit digital output, said shift register unit including $n$ shift registers, wherein $n$ is an integer, each connected to receive the output from a corresponding one of said $n$ comparator means with the shift register coupled to the comparator producing the most significant bit having $n$ delay times for a data signal applied thereto and each succeeding shift register having one less delay time than the preceding shift register.

References Cited

UNITED STATES PATENTS

| | | | |
|---|---|---|---|
| 3,345,502 | 10/1967 | Berg et al. | 235—92 |
| 3,188,624 | 6/1965 | McMillian | 340—347 |

MAYNARD R. WILBUR, Primary Examiner

J. GLASSMAN, Assistant Examiner